United States Patent
Huang et al.

(10) Patent No.: US 8,313,959 B1
(45) Date of Patent: Nov. 20, 2012

(54) HOLE FIRST HARDMASK DEFINITION

(75) Inventors: Wei-Hang Huang, Kaohsiung (TW);
Shih-Chang Liu, Alian Township (TW);
Chern-Yow Hsu, Chu-Bei (TW);
Fu-Ting Sung, Yangmei (TW);
Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/211,909

(22) Filed: Aug. 17, 2011

(51) Int. Cl.
*H01L 21/00* (2006.01)

(52) U.S. Cl. .......................................................... 438/3

(58) Field of Classification Search .............. 438/3, 243, 438/253, 386, 396
See application file for complete search history.

(56) References Cited

U.S. PATENT DOCUMENTS

| | | | |
|---|---|---|---|
| 2005/0078510 A1* | 4/2005 | Jeong et al. | 365/158 |
| 2011/0180888 A1* | 7/2011 | Xi et al. | 257/421 |
| 2011/0235217 A1* | 9/2011 | Chen et al. | 360/324.2 |

* cited by examiner

*Primary Examiner* — Kevin M Picardat
(74) *Attorney, Agent, or Firm* — Slater & Matsil, L.L.P.

(57) ABSTRACT

A semiconductor device and a method of manufacture are provided, such as a MTJ device and a method of manufacturing a MTJ device. The MTJ device may include a bottom electrode, a MTJ stack, and a top electrode, wherein the top electrode is formed using a hole-filling technique. The top electrode may have slanted sidewalls. The MTJ stack may be formed by depositing corresponding MTJ layers. A patterned mask may be formed and patterned over the MTJ layers to form an opening defining the top electrode. The opening is filled with a conductive material to form the top electrode. The top electrode is then used as a mask to pattern the MTJ layers, thereby forming a MTJ stack.

13 Claims, 8 Drawing Sheets

HOLE FIRST HARDMASK DEFINITION

BACKGROUND

Semiconductor storage devices are used in integrated circuits for electronic applications, including radios, televisions, cell phones, and personal computing devices. Commonly known storage devices include charge-storing devices such as dynamic random access memories (DRAMs) and flash memories.

A more recent development in storage devices involves spin electronics, which combine semiconductor technology and magnetic materials. The spin polarization of electrons, rather than the charge of the electrons, is used to indicate the state of "1" or "0." One such spin electronic device is a spin torque transfer (STT) magnetic tunneling junction (MTJ) device.

Generally, an MTJ device includes free layer, pinned layer, and a tunnel layer interposed between the free layer and the pinned layer. The magnetization direction of the free layer can be reversed by applying a current through the tunnel layer, which causes the injected polarized electrons within the free layer to exert spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer, flowing through the tunnel layer, and then into and accumulating in the free layer. Eventually, the magnetization of the free layer is parallel to that of the pinned layer, and the MTJ device will be at a low resistance state. The electron injection caused by current is referred to as a major injection.

When current flowing from the pinned layer to the free layer is applied, electrons flow in the direction from the free layer to the pinned layer. The electrons having the same polarization as the magnetization direction of the pinned layer are able to flow through the tunnel layer and into the pinned layer. Conversely, electrons with a polarization differing from the magnetization of the pinned layer will be reflected (blocked) by the pinned layer, and will accumulate in the free layer. Eventually, magnetization of the free layer becomes anti-parallel to that of the pinned layer, and the MTJ device will be at a high-resistance state. The respective electron injection caused by current is referred to as a minor injection.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

Embodiments are disclosed in a specific concept, namely, a novel method for forming a magnetic tunnel junction (MTJ) cell. The intermediate stages of manufacturing an embodiment are illustrated, and variations of the embodiment are discussed. However, other embodiments may be utilized for patterning other structures. Throughout the various views and illustrative embodiments, like reference numbers are used to designate like elements.

Figure 1:
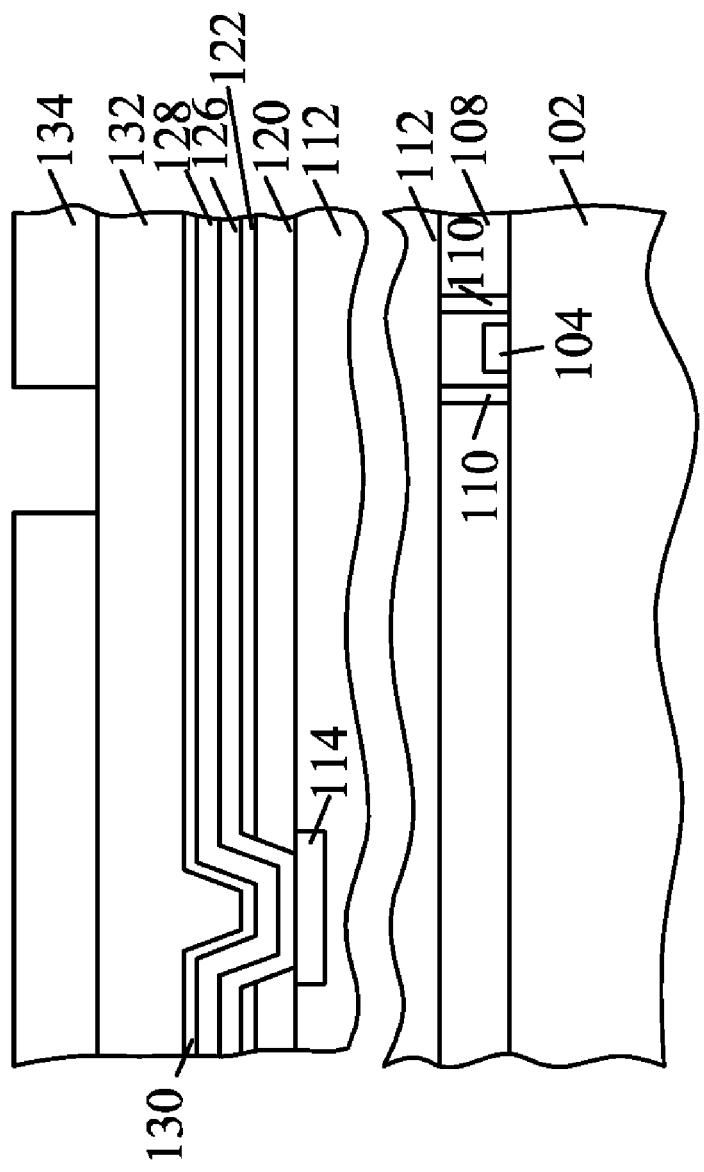
FIGS. 1-6 illustrate intermediate stages of forming a magnetic tunnel junction (MTJ) cell in accordance with an embodiment.

Referring first to FIGS. 1-6, there are shown various intermediate stages for forming a MTJ device in accordance to an embodiment. Referring first to FIG. 1, a portion of a substrate 102 having electrical circuitry, illustrated by reference numeral 104, formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used.

Electrical circuitry 104 formed on the substrate 102 may be any type of circuitry suitable for a particular application. In an embodiment, the electrical circuitry 104 includes electrical devices formed on the substrate 102 with one or more dielectric layers overlying the electrical devices. Metal layers may be formed between dielectric layers to route electrical signals between the electrical devices. Electrical devices may also be formed in one or more dielectric layers.

For example, the electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. For example, in an embodiment in which the semiconductor device being formed is a MRAM device, the electrical circuitry may include control circuitry and/or logic circuitry. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 108. The ILD layer 108 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 108 may comprise a plurality of dielectric layers.

Contacts, such as contacts 110, are formed through the ILD layer 108 to provide an electrical contact to the electrical circuitry 104. The contacts 110 may be formed, for example, by using photolithography techniques to deposit and pattern a photoresist material on the ILD layer 108 to expose portions of the ILD layer 108 that are to become the contacts 110. An etch process, such as an anisotropic dry etch process, may be used to create openings in the ILD layer 108. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, combinations thereof, or the like, thereby forming the contacts 110 as illustrated in FIG. 1.

One or more inter-metal dielectric (IMD) layers 112 and the associated metallization layers (not shown) are formed over the ILD layer 108. Generally, the one or more IMD layers 112 and the associated metallization layers are used to interconnect the electrical circuitry 104 to each other and to provide an external electrical connection. The IMD layers 112 may be formed of a low-K dielectric material, such as FSG formed by PECVD techniques or high-density plasma CVD (HDPCVD), or the like, and may include intermediate etch stop layers. In an embodiment, ILD layer and/or the IMD dielectric layer comprises a dielectric material having a k value of less than about 2.5, sometimes referred to as an extreme low-k (ELK) dielectric layer. Conductive pads 114 are provided to provide electrical connections.

It should be noted that one or more etch stop layers (not shown) may be positioned between adjacent ones of the dielectric layers, e.g., the ILD layer 108 and the IMD layers 112. Generally, the etch stop layers provide a mechanism to stop an etching process when forming vias and/or contacts. The etch stop layers are formed of a dielectric material having a different etch selectivity from adjacent layers, e.g., the underlying semiconductor substrate 102, the overlying ILD layer 108, and the overlying IMD layers 112. In an embodiment, etch stop layers may be formed of SiN, SiCN, SiCO, CN, combinations thereof, or the like, deposited by CVD or PECVD techniques.

A first insulation layer 120 and a second insulation layer 122 may be formed over the IMD layer 112. In an embodiment, the first insulation layer 120 may be, for example, a silicon carbon layer, and the second insulation layer 122 may be, for example, a silicon nitride layer. In other embodiments, however, different materials may be used. For example, the first insulation layer 120 may be oxides/nitrides and the like which can be deposited on IMD layer 112 well and with little or no deformation by stress effect, and the second insulation layer 122 may be oxides/nitrides and the like which can fit LIT process window (focal distance/pattern energy/PR material). The material of the first insulation layer 120 may be based upon the material selected for the IMD layer 112. The first insulation layer 120 and the second insulation layer 122 may be formed using blanket deposition methods such as CVD or PECVD techniques, and patterned using photolithography techniques to expose at least a portion of the conductive pad 114.

A bottom electrode layer 126 and MTJ layers 128 are formed over the patterned first and second insulation layers by, for example, using blanket deposition methods. Bottom electrode layer 126 is formed of a conductive material, such as a metal or a metal alloy. In an embodiment, bottom electrode layer 126 is formed of tantalum (Ta), but other materials, such as titanium (Ti), and the like, may be used.

MTJ layers 128 may include various layers formed of different combinations of materials. In an embodiment, MTJ layers 128 include a pinning layer, a tunnel barrier layer, and a free layer. In addition, MTJ layers 128 may have other variations including other layers, such as anti-ferro-magnetic layers (not shown). In an embodiment, the pinning layer and the free layer may be formed a ferromagnetic material such as Co, Fe, NiFe, CoFe, CoFeB, and the like, and the tunnel barrier layer may be formed of $AlO_3$, MgO, $ZrO_2$, $Ta_2O_3$, $HfO_2$, NiO, AlN, and the like. The magnetic moment of the free layer may be programmed causing the resistance of the resulting MTJ cell to be changed between a high resistance state and a low resistance state. It is realized that MTJ layers 128 may have many variations, which are also within the scope of the present disclosure.

FIG. 1 further illustrates a conformal seed layer 130 deposited over the surface of the second insulation layer 122. The seed layer 130 is a thin layer of a conductive material that aids in the formation of a thicker layer during subsequent processing steps. In an embodiment, the seed layer 130 may be formed by depositing a thin conductive layer, such as a thin layer of Ta, using CVD or PVD techniques. Other materials, such as, for example, Ti, Cu, TiN, TaN, combinations thereof, or the like, may be used.

Thereafter, as illustrated in FIG. 1, a hardmask layer 132 is formed over the seed layer 130, and a patterned mask 134 is formed and patterned over the hardmask layer 132 in accordance with an embodiment. The hardmask layer 132 may be, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). The hardmask layer 132 may have a thickness of about 1000 Å to about 2000 Å, actual thickness of 132 may be selected for polish uniformity control of a subsequent CMP process (e.g., a CMP process used to forming a top electrode 440 discussed below with reference to FIG. 4). It should also be noted that the hardmask layer 132 may comprise a plurality of layers.

The patterned mask 134 defines the shape of a top electrode to be subsequently formed as discussed below. The patterned mask 134 may be a patterned photoresist mask, hard mask, a combination thereof, or the like.

Figure 2:
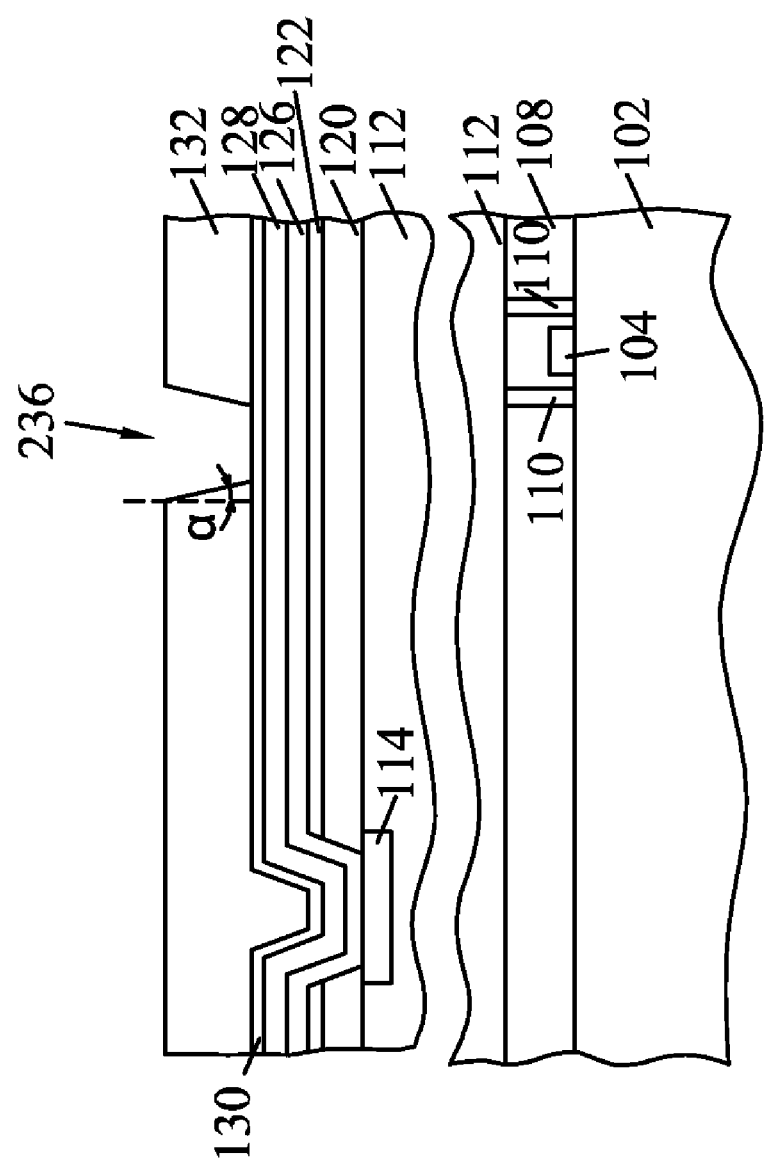

FIG. 2 illustrates patterning the hardmask layer 132 in accordance with an embodiment. The hardmask layer 132 may be patterned using a wet or dry, anisotropic or isotropic etch process, but preferably is an anisotropic dry etch process. After patterning the hardmask layer 132, the patterned mask 134 (see FIG. 1) may be removed. In an embodiment in which the patterned mask 134 comprises a photoresist, the patterned mask 134 may be removed by, for example, an oxygen plasma ashing process followed, optionally, by a wet dip in a sulfuric acid ($H_2SO_4$) solution to clean the wafer and remove remaining photoresist material.

As will be discussed in greater detail below, patterning the hardmask layer 132 results in an opening 236 that will subsequently be filled with a conductive material to act as a top electrode to a MTJ cell. Due to the etching process to form the opening 236, the sidewalls may be slanted. As a result, the top electrode formed in the opening 236 in subsequent steps, as discussed below with reference to FIGS. 3 and 4, may exhibit slanted sidewalls as well. In an embodiment, the slant of the sidewalls, indicated as a in FIG. 2, may be from about 0° to about 10° relative to normal to a major surface of the substrate 102.

Figure 3:
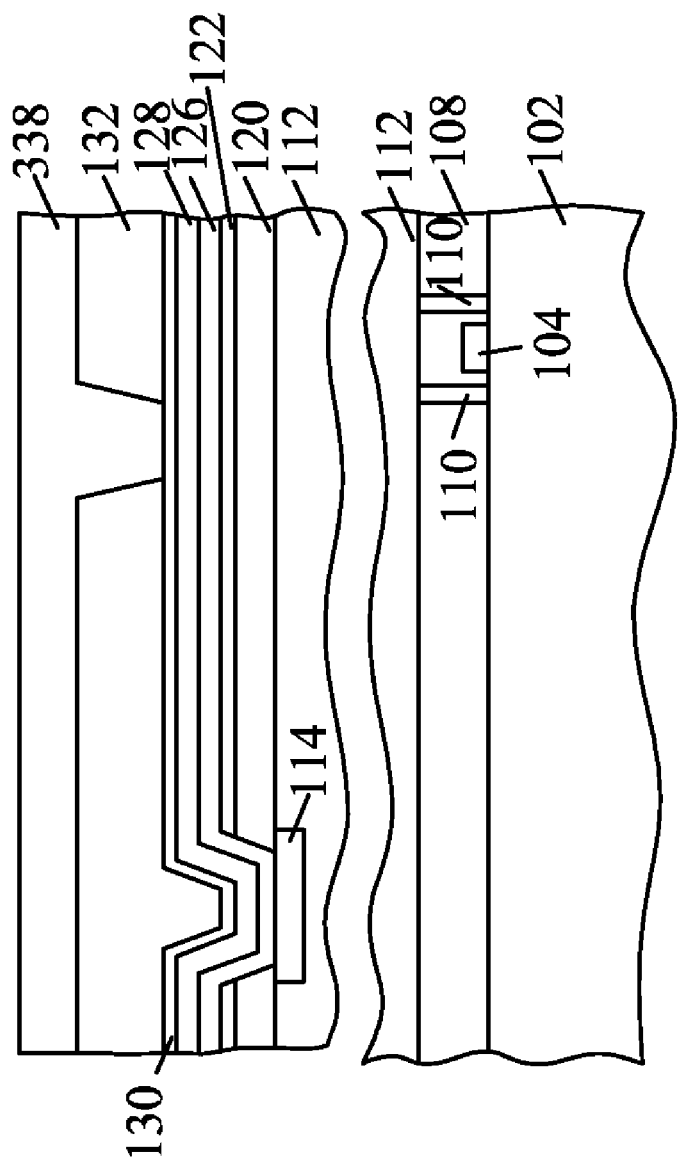
Figure 4:
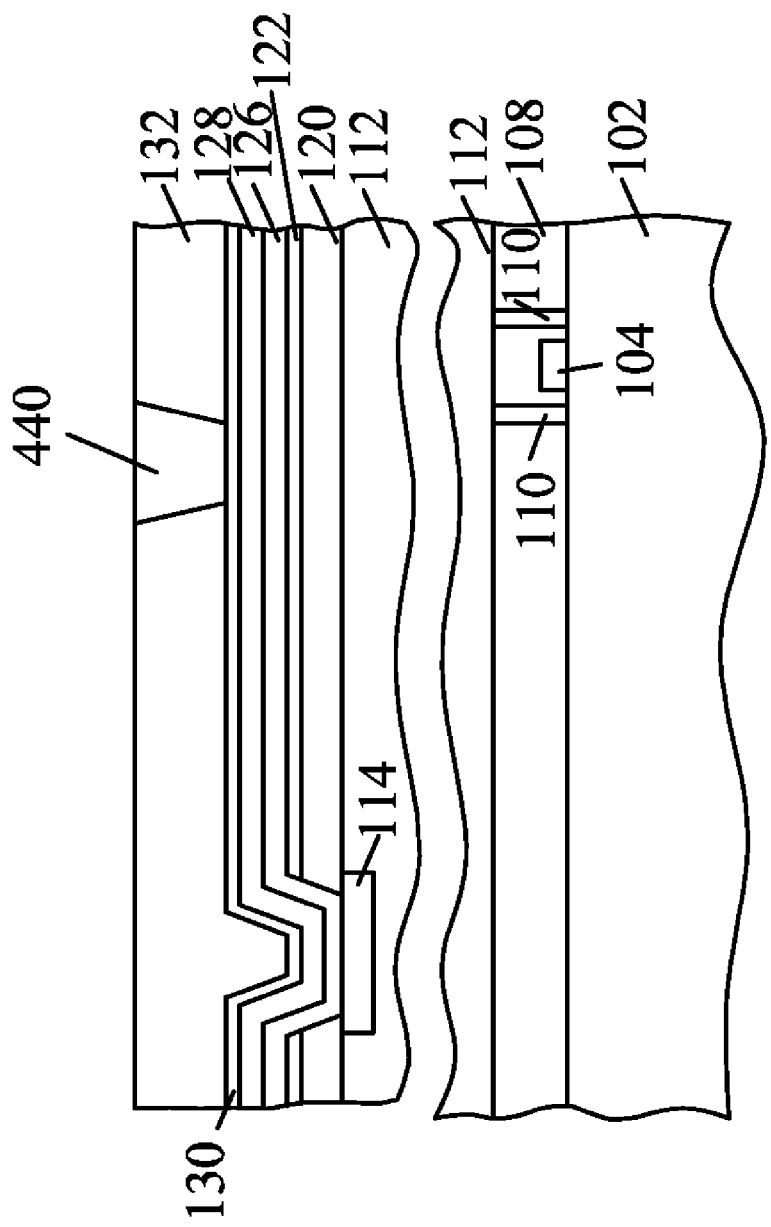

FIG. 3 illustrates depositing a conductive layer 338 in accordance with an embodiment. The conductive layer 338 may be formed by depositing a layer of conductive material, such as Ta. Other materials, however, such as TiN, TaN, ruthenium, or the like, may also be used. After the conductive layer 338 is formed, the excess conductive material on the surface of the hardmask layer 132 is removed by, for example, a CMP process or an etch back process or the like, as illustrated in FIG. 4, thereby forming a top electrode 440.

Figure 5:
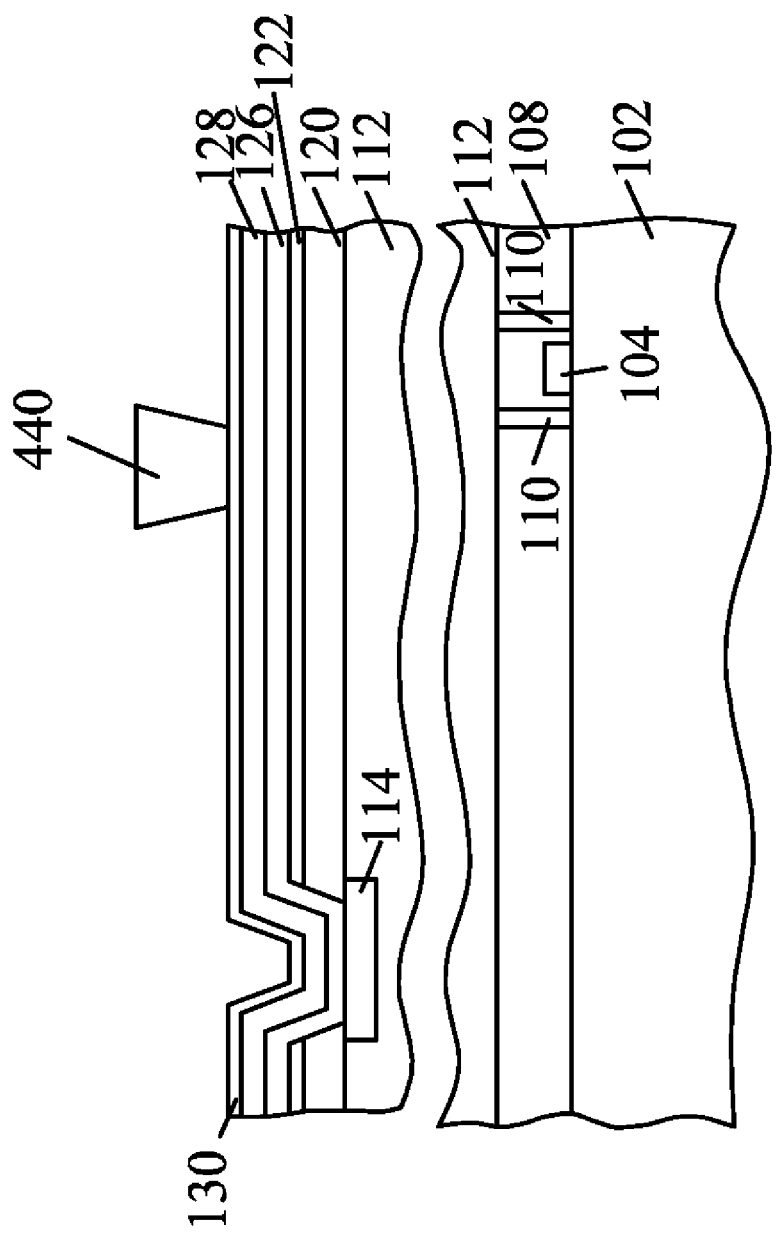

FIG. 5 illustrates removing of the hardmask layer 132 in accordance with an embodiment. The hardmask layer 132 may be removed using an etching process, wet or dry, anisotropic or isotropic etch process.

Figure 6:
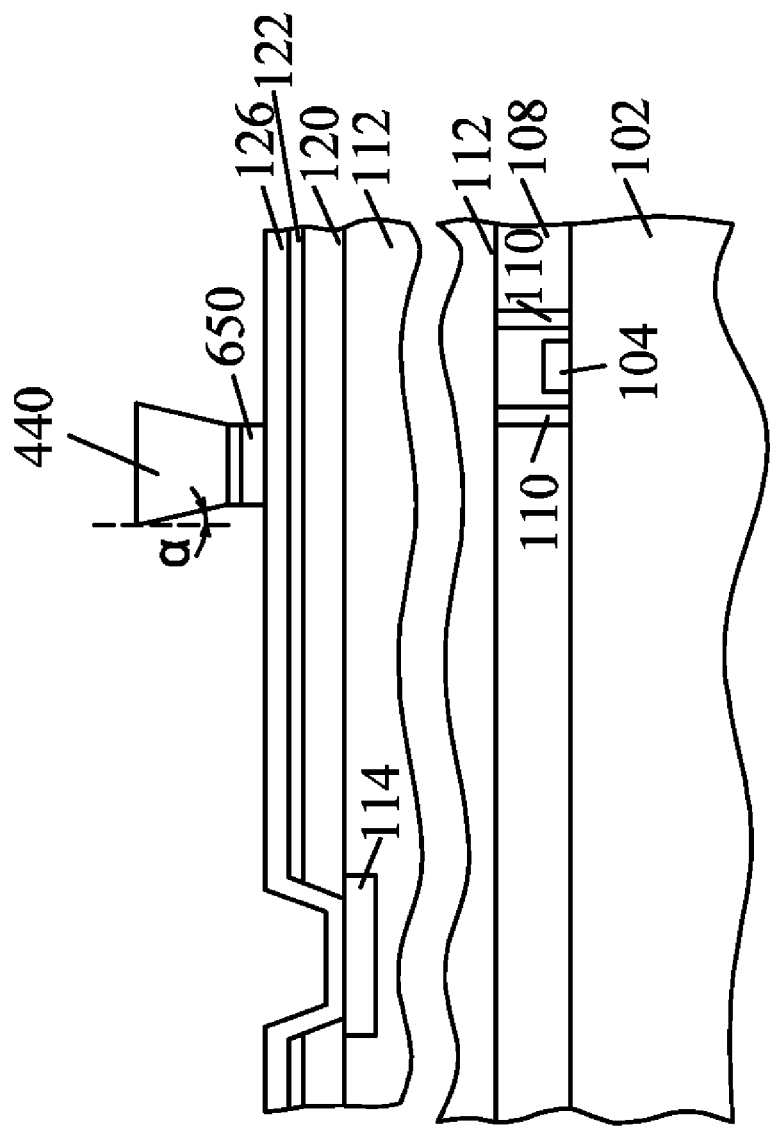

FIG. 6 illustrates patterning of the seed layer 130 and the MTJ layers 128 to form an MTJ stack 650 in accordance with an embodiment. In an embodiment in which the top electrode layer 440 is formed of tantalum, the seed layers 130 may be patterned, for example, using a halogen-containing compound, such as $CF_4$. Thereafter, the MTJ layers 128 may be patterned wherein the top electrode 440 acts as a mask. In an embodiment, the MTJ may be etched using alkanols, such as methanol ($CH_3OH$), ethanol, and butanol), or a carbon oxide (s) combined with an ammonia-containing compound(s) (e.g. $CO+NH_3$).

Figure 7B:
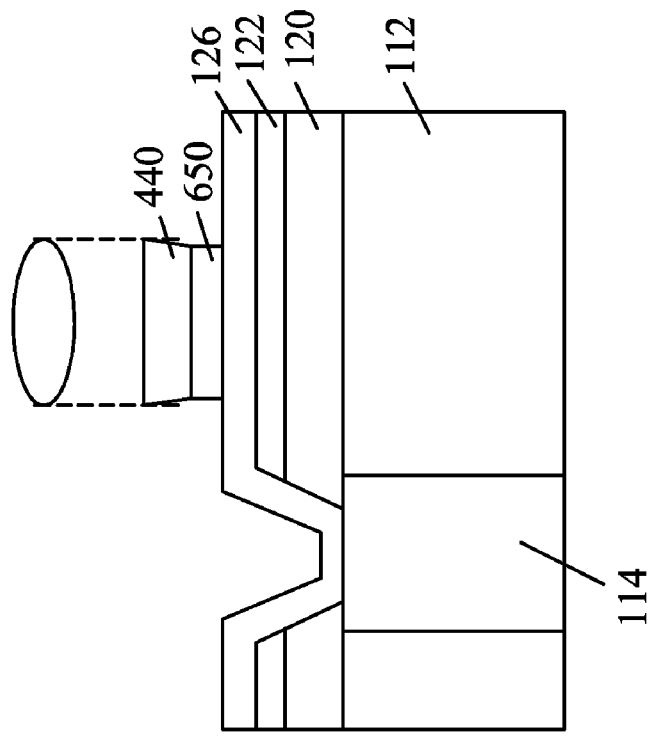
FIGS. 7a and 7b compares and contrast electrode shapes obtained using a photoresist masking approach and a hole-filling approach in accordance with an embodiment.
Figure 7A:
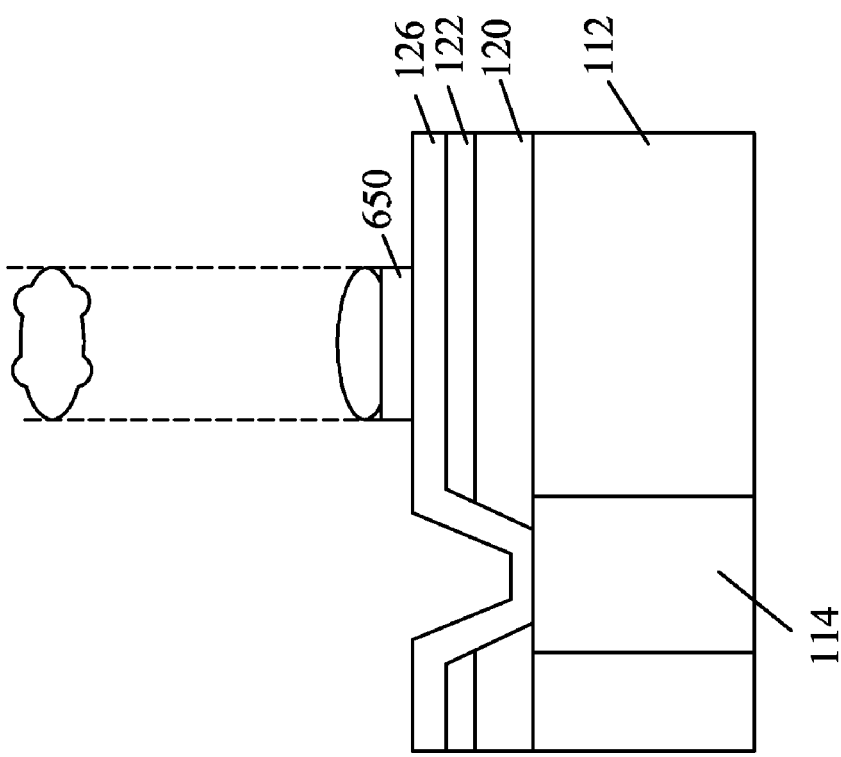

As discussed above with reference to FIG. 2, the top electrode 440 may have slanted sidewalls as indicated by the angle α relative to normal to a major surface of the substrate 102. This shape is in part due to using a hole-filling technique for forming the top electrode. By using the hole-filling technique disclosed herein, middle necking of the photoresist mask may be avoided, and subsequently, rounding of the edges of the top electrode may be reduced and/or avoided. For purposes of illustration and comparison, FIG. 7a illustrates the top shape of the top electrode obtained using a photoresist process for patterning the top electrode in FIG. 7a, as compared to the top electrode illustrated in FIG. 7b obtained using the hole-filling technique described above. As illustrated in FIGS. 7a and 7b, the use of a photoresist to pattern a top electrode layer may cause an irregular shape due to the un-robust nature of the photoresist used to protect the top electrode during patterning. As a result, the after-etch inspection (AEI) critical dimension uniformity (CDU) may be negatively impacted.

It should be noted that the above description indicates that the MTJ stack 650 is formed in one of the metallization layers. For example, in an embodiment, the conductive pad 114 may be formed in the third metallization layer. In other embodiments, however, the MTJ stack 650 may be formed in a lower or higher metallization stack, or on the substrate 102. It should be further noted that the materials and structure, e.g., the structure of the lower electrode 126 is provided for illustrative purposes only and that other embodiments may utilize different materials and structures.

Figure 8:
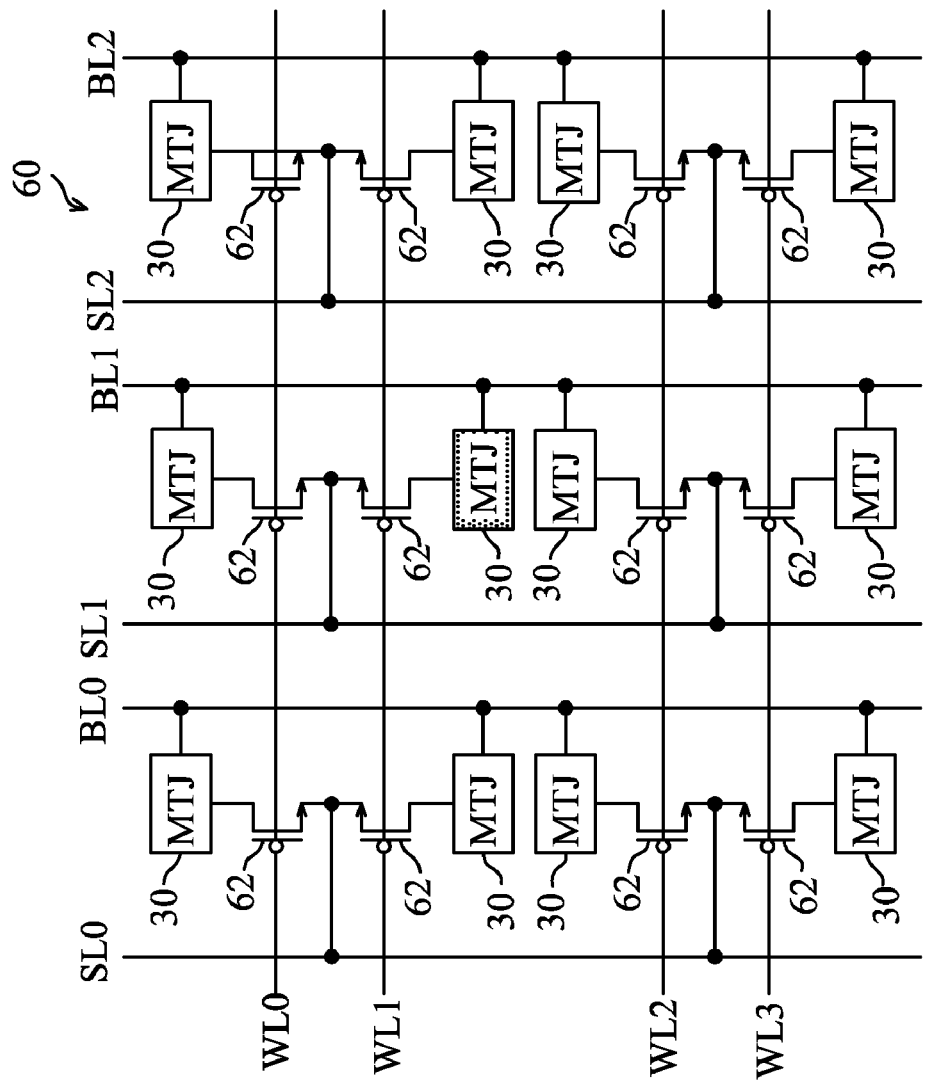
FIG. 8 illustrates a memory array formed of the MRAM embodiments disclosed herein.

FIG. 8 illustrates MRAM array 60 formed of the MTJ cell embodiments of the present invention. MTJ cells 30 are arranged as array 60 having columns and rows. Each of the MTJ cells 30 is connected between one of the bit lines BL (referred to as BL0, BL1, . . . and the like.) and one of the source lines SL (referred to as SL0, SL1, . . . and the like). Select transistor 62 is controlled by one of word lines WL (referred to as WL0, WL1, . . . and the like). The write currents of MTJ cells 30 are applied between the bit lines BL and the source lines SL. Word lines WL also control which one of the MTJ cells 30 is operated.

In an embodiment, a method of forming an integrated circuit structure is provided. The method includes providing a substrate that has a bottom electrode layer and MTJ stack layers formed thereon. A mask layer covering the MTJ stack layers is formed, and an opening in the mask layer to expose a portion of the MTJ stack layers is formed. A top electrode is formed in the opening, which top electrode then acts as a mask for patterning the MTJ stack layers, thereby forming an MTJ stack.

In yet another embodiment, a method of forming an integrated circuit structure, such as an MRAM array, is provided. The method includes providing a substrate that has a bottom electrode layer and a plurality of MTJ layers formed thereon. A mask layer is formed over the MTJ layers and a plurality of openings is formed in the mask layer. A plurality of top electrodes is formed, each being positioned within respective ones of the plurality of openings. Thereafter, the mask layer is removed and the plurality of top electrodes are used to pattern the plurality of MTJ layers.

In yet another embodiment, an integrated circuit is provided. The integrated circuit includes a substrate having a bottom electrode and MTJ stack formed thereon. A top electrode is positioned over the MTJ stack, the top electrode being narrower adjacent to the MTJ stack than a top of the MTJ stack.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit, the method comprising:
    providing a substrate, the substrate having a bottom electrode layer and magnetic tunnel junction (MTJ) stack layers formed thereon;
    forming a mask layer covering the MTJ stack layers;
    forming an opening in the mask layer to expose a portion of the MTJ stack layers;
    forming a top electrode in the opening; and
    patterning the MTJ stack layers using the top electrode as a mask, thereby forming an MTJ stack.

2. The method of claim 1, further comprising removing the mask layer prior to the patterning the MTJ stack layers.

3. The method of claim 1, wherein the forming the top electrode comprises depositing a conductive material, the conductive material extending over a surface of the mask layer.

4. The method of claim 3, further comprising planarizing a surface of the mask layer and the conductive material, the planarizing removing the conductive material from a surface of the mask layer.

5. The method of claim 1, wherein the opening has slanted sidewalls.

6. The method of claim 5, wherein the slanted sidewalls have an angle of about 0° to about 10° relative to normal to a major surface of the substrate.

7. The method of claim 1, wherein the forming the mask layer comprises forming the mask layer over a metallization layer.

8. The method of claim 1, wherein the substrate comprises a silicon nitride layer under the bottom electrode and a silicon carbide layer under the silicon nitride layer.

9. A method of forming an integrated circuit, the method comprising:

providing a substrate, the substrate having a bottom electrode layer and a plurality of magnetic tunnel junction (MTJ) layers formed thereon;

forming a thin top electrode film over the plurality of MTJ layer;

forming a mask layer over the thin top electrode film;

forming a plurality of openings in the mask layer;

forming a plurality of top electrodes, each of the plurality of top electrodes being positioned within respective ones of the plurality of openings;

removing the mask layer; and patterning the plurality of MTJ layers using the plurality of top electrodes as a mask, thereby forming a plurality of MTJ stacks.

10. The method of claim 9, wherein the forming the plurality of top electrode comprises depositing a conductive material, the conductive material extending over a surface of the mask layer.

11. The method of claim 10, further comprising planarizing a surface of the mask layer and the conductive material, the planarizing removing the conductive material from a surface of the mask layer.

12. The method of claim 9, wherein the plurality of openings have slanted sidewalls.

13. The method of claim 12, wherein the slanted sidewalls have an angle of about 0° to about 10° relative to normal to a major surface of the substrate.

* * * * *